United States Patent [19]
LeWalter

[11] Patent Number: 5,739,708
[45] Date of Patent: Apr. 14, 1998

[54] CIRCUIT CONFIGURATION FOR GENERATING AN ENABLE SIGNAL FOR A CLOCK-CONTROLLABLE CIRCUIT

[75] Inventor: Siegfried LeWalter, Munich, Germany

[73] Assignee: Siemens Aktiengesellschaft, Munich, Germany

[21] Appl. No.: 715,931

[22] Filed: Sep. 19, 1996

[30] Foreign Application Priority Data

Sep. 19, 1995 [DE] Germany ............... 195 34 785.4

[51] Int. Cl.⁶ .................................................. H03K 17/22
[52] U.S. Cl. .................... 327/143; 327/142; 327/160; 327/198
[58] Field of Search .................................. 327/142, 143, 327/160, 198

[56] References Cited

U.S. PATENT DOCUMENTS

| | | | |
|---|---|---|---|
| 4,300,065 | 11/1981 | Remedi et al. | 327/436 |
| 5,028,824 | 7/1991 | Young | 327/262 |
| 5,231,319 | 7/1993 | Crafts et al. | 327/277 |
| 5,343,085 | 8/1994 | Fujimoro et al. | 327/143 |
| 5,376,834 | 12/1994 | Carobolante | 327/143 |

FOREIGN PATENT DOCUMENTS

| | | |
|---|---|---|
| 39 40 745 C1 | 4/1991 | Germany. |
| 59-212025 | 11/1984 | Japan ............ 327/142 |

OTHER PUBLICATIONS

Patent Abstracts of Japan No. 59–156018 (Tachibana), dated Sep. 5, 1984.

*Primary Examiner*—Timothy P. Callahan
*Assistant Examiner*—Kenneth B. Wells
*Attorney, Agent, or Firm*—Herbert L. Lerner; Laurence A. Greenberg

[57] ABSTRACT

A circuit configuration for generating an enable signal for a clock-controlled circuit includes a device for generating a power-on reset signal. Deactivation of that signal is delayed through the use of a delay device, and is used for enabling a clock signal output by an oscillator. The circuit is controlled in clocked fashion through the use of the signal. A delay time of the delay device is controlled by the oscillator through a level weighting device, preferably a Schmitt trigger. As a result, the clock signal is not enabled until the oscillator is oscillating at stable amplitude and at a desired frequency.

4 Claims, 1 Drawing Sheet

CIRCUIT CONFIGURATION FOR GENERATING AN ENABLE SIGNAL FOR A CLOCK-CONTROLLABLE CIRCUIT

BACKGROUND OF THE INVENTION

FIELD OF THE INVENTION

The invention relates to a circuit configuration for generating an enable signal for a clock-controllable circuit having a clock generator.

Clock-controlled circuits, especially microprocessors, are supplied by a clock generator that furnishes a reference clock signal. The clock generator is typically a quartz oscillator. It is known to take a relatively long time for the quartz oscillator, after the supply voltage is turned on, to attain a steady state and have a stable oscillation frequency at a stable oscillation amplitude. German Patent DE 39 40 745 C1 describes a circuit configuration in which immediately after the supply voltage is applied, for supplying the clock signal, first a switchover to a fast-buildup RC oscillator is made, and then once the quartz oscillator has attained a steady state the switchover to it is made. The switchover is attained on the basis of a frequency comparison, or on the basis of a counting device that follow the quartz oscillator. Moreover, that patent describes maintaining the active state of the reset signal until the already steady-state oscillator, that is the RC oscillator, has carried out a certain minimum number of oscillator periods.

A disadvantage of the known configuration is the increased expense for circuitry for the RC oscillator and for the switchover device for switching between the RC and the quartz oscillator.

SUMMARY OF THE INVENTION

It is accordingly an object of the invention to provide a circuit configuration for generating an enable signal for a clock-controlled circuit, which overcomes the hereinaforementioned disadvantages of the heretofore-known devices of this general type, which entails less expense for circuitry and which reliably avoids generating the enable signal until an oscillator has attained a steady state.

With the foregoing and other objects in view there is provided, in accordance with the invention, a circuit configuration for generating an enable signal for a clock-controlled circuit, comprising a device for supplying a pulse generated by an increase in supply voltage; a clock generator supplied by the supply voltage; a level weighting device triggered by the clock generator; a counter being clock-controlled by the level weighting device and outputting a signal once a predetermined counter state is reached; and a memory element to be put into a first of two states by the pulse supplied by the device and into a second of the two states by the signal output by the counter, the memory element having an output for supplying an enable signal for a clock-controlled circuit.

An essential feature of the circuit configuration of the invention is the use of a level weighting device, with which oscillation signals output by the clock generator are weighted with respect to their amplitude. Until a stable, steady-state oscillation is established at the clock generator output, what is essentially present is a noise signal, that is effectively suppressed by the level weighting device. In German Patent DE 39 40 745 C1 referred to above, counting of the oscillator periods, during which the reset signal is intended to still be kept active, is carried out only in the reliably steady state of one of the oscillators. In comparison to the invention, this requires the aforementioned higher expense for circuitry, in the form of an additional, fast-buildup RC oscillator.

In accordance with another feature of the invention, the level weighting device makes a comparison of the signal output by the clock generator with at least two threshold values. In the practical embodiment, the threshold values are as symmetrical as possible relative to the operating point of the oscillator.

In accordance with a further feature of the invention, a Schmitt trigger having an input side connected to the clock generator and an output side connected to the counter is used for the level weighting.

A starting pulse, expediently a pulse generated as a function of a supply voltage, is delayed through the use of the delay device controlled by the Schmitt trigger. This pulse can be generated by a so-called power-on reset circuit, which generates a pulse of suitable length when the supply voltage rises. One example of a power-on reset circuit is described in U.S. Pat. No. 4,300,065.

The delay by which one edge of the pulse furnished by the power-on reset circuit is varied by the level weighting device is influenced in such a way that through the use of the pulses output by the level weighting device, a counter is incremented. Upon reaching a certain counter state, such as an overflow, it outputs a signal by which the power-on reset pulse, that was retained until then, is ended.

The enable signal thus generated indicates that the oscillator is in the steady state at a stable frequency and stable amplitude, and operation of the clock-controlled circuit controlled by the clock generator can then reliably begin. To that end, for instance, the logic circuits of the clock-controlled circuit, which until then were reset to an initial state, are enabled, and/or the circuit to be controlled at the clock pace is connected to the clock generator and thus enabled. Through the use of the counter in combination with the level weighting device, individual interference pulses that were already output by the oscillator before the steady state are prevented from terminating the reset state.

In accordance with a concomitant feature of the invention, the counter has a reset input controlled by the pulse supplied by the device.

Other features which are considered as characteristic for the invention are set forth in the appended claims.

Although the invention is illustrated and described herein as embodied in a circuit configuration for generating an enable signal for a clock-controllable circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
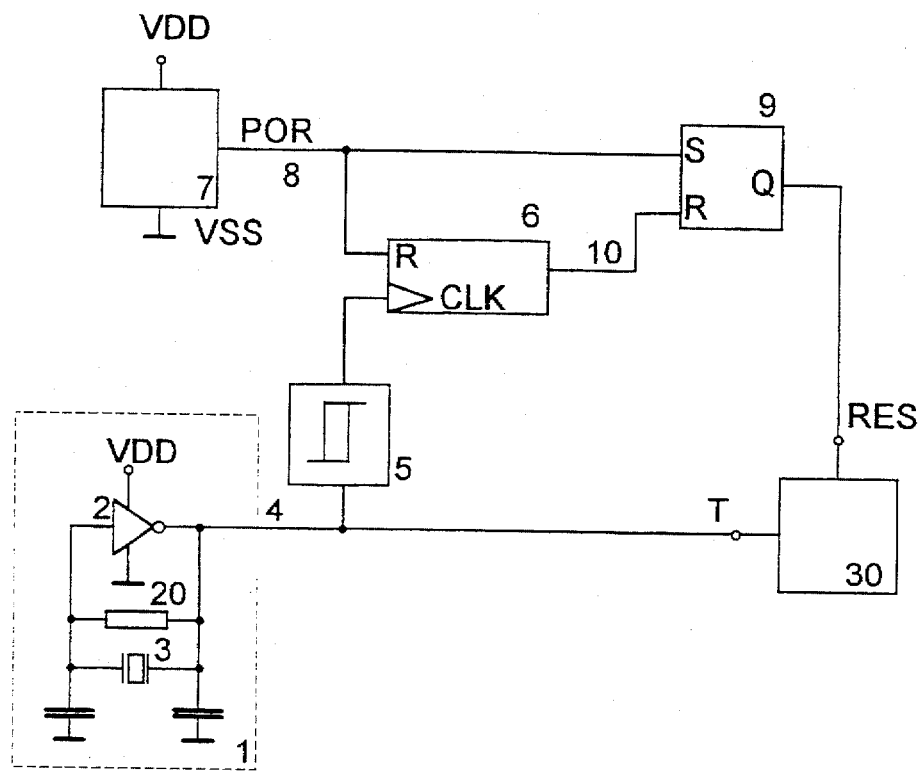
FIG. 1 is a schematic and block circuit diagram of a circuitry embodiment of the circuit of the invention.

Referring now to the figures of the drawings in detail and first, particularly, to FIG. 1 thereof, there is seen a circuit which includes a quartz oscillator 1 as its clock generator. Individually, the quartz oscillator has an amplifier 2, which is supplied by supply potentials VDD, VSS that form a supply voltage. Inputs and outputs of the inverter amplifier 2 are coupled to one another through a quartz 3. An output 4 of the quartz oscillator 1 is connected to a level weighting or evaluating device 5 constructed as a Schmitt trigger. An output of the Schmitt trigger 5 supplies a clock input of a counter 6. A device 7, which is connected to the supply voltage VDD, VSS, generates a pulse when the supply voltage rises. The device 7 is expediently a conventional circuit for generating a power-on reset signal POR. The signal POR at an output 8 of the device 7 is supplied to both a reset input of the counter 6 and to one input, for instance a set input, of an RS flip-flop 9. A reset input of the flip-flop 9 is connected to one output 10 of the counter 6. A signal at the terminal 10 is generated whenever the counter 6 has reached a certain counter state, such as an overflow. An enable signal RES can be picked up at an output Q of the flip-flop 9. The counter 6 and the flip-flop 9 form a delay device for the signal POR. A delayed edge of the signal RES indicates that the quartz oscillator 1 has attained a steady state and is furnishing an output clock signal T of stable amplitude and frequency. In a practical sense, the signal RES is used for adjusting a predetermined initial state of a clock-controlled circuit 30 that is to be supplied by the oscillator 1 with the clock signal T. Upon deactivation of the signal RES, this circuit then resumes its operation.

Figure 2:
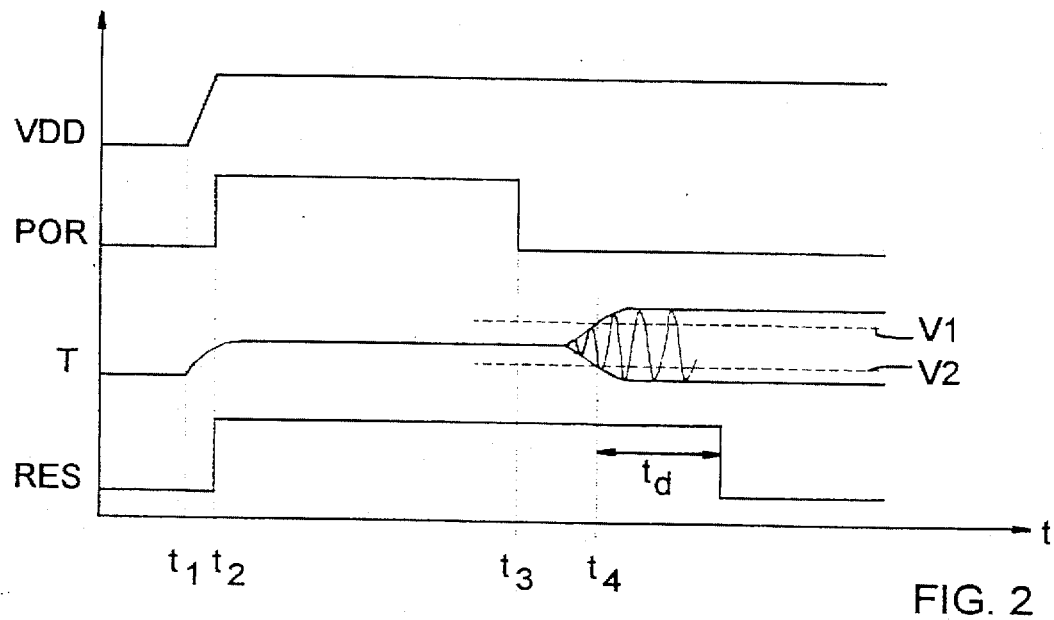
FIG. 2 is a graph showing signals that occur in FIG. 1.

The mode of operation of the circuit shown in FIG. 1 will be described below in terms of the signal graph shown in FIG. 2. At a time $t_1$, a positive signal of the supply voltage VDD begins to rise. At the same time, the quartz oscillator 1 moves to its operating point, which is determined essentially by a feedback resistor 20 in an input/output signal path of the inverter amplifier 2. Once the supply voltage has attained a certain value, the power-on reset signal POR is generated at a time $t_2$. Accordingly, the flip-flop 9 and thus its output signal RES are set. After a period of time determined by the characteristics of the circuit 7, the signal POR becomes inactive again at a time $t_3$. However, the oscillator 1 has not yet reached its steady state. There is not yet a valid clock signal T at the output 4 of the oscillator. Instead, noise pulses may appear there. The signal RES, however, continues to be active, so that the circuit units supplied by the quartz oscillator 1 are not yet affected by the oscillator output signal T. Threshold values formed by the Schmitt trigger 5 are designated by reference symbols V1 and V2. It is not until a time $t_4$, when the oscillator amplitude exceeds or drops below the respective threshold values V1, V2, that a clock signal is generated at the output of the Schmitt trigger, by which signal the counter 6 is clocked. Until then, the counter 6 was reset to its zero state by the signal POR. After the end of a delay time $t_d$ fixed by the overflow of the counter 6, the flip-flop 9 is reset, so that its output signal RES is deactivated again.

The above-described circuit accordingly functions in such a way that the deactivation of the power-on reset signal POR is delayed by the number of clock signals determined by the overflow value of the counter 6. This presents individual interference pulses already output by the quartz oscillator 1 between the times $t_2$ and $t_4$, and particularly between the times $t_3$ and $t_4$, from leading to a malfunction in the circuit 30 to be supplied with the clock signal T. It is assured that the reset state of the circuit 30 remains active until such time as the amplitude of the oscillator 1 has reached a minimum amplitude, so that it is thus definite that the desired frequency has been attained.

In the case of the level weighting device 5, besides the Schmitt trigger shown in FIG. 1, any circuit that carries out a level evaluation of the output signal of the oscillator 4 with respect to at least two levels is suitable. Expediently, the levels are symmetrical to the operating point of the oscillator 1. The threshold comparison can be carried out by two comparators as well, for instance, which ascertain if the reference threshold V1 is exceeded or the reference threshold V2 is undershot, and trigger the set or reset input of a flip-flop accordingly.

I claim:

1. A circuit configuration for generating an enable signal for a clock-controlled circuit, comprising:

a device for supplying a pulse generated by an increase in supply voltage;

a clock generator supplied by the supply voltage;

a level weighting device triggered by said clock generator;

a counter being clock-controlled by said level weighting device and outputting a signal once a predetermined counter state is reached; and a memory element to be put into a first of two states by the pulse supplied by said device and into a second of the two states by the signal output by said counter, said memory element having an output for supplying an enable signal for a clock-controlled circuit.

2. The circuit configuration according to claim 1, wherein said level weighting device compares the signal output by said clock generator with at least two threshold values.

3. The circuit configuration according to claim 2, wherein said level weighting device is a Schmitt trigger having an input side connected to said clock generator and an output side connected to said counter.

4. The circuit configuration according to claim 1, wherein said counter has a reset input controlled by the pulse supplied by said device.

* * * * *